US012670637B2

(12) United States Patent
Dalton

(10) Patent No.: US 12,670,637 B2
(45) Date of Patent: Jun. 30, 2026

(54) SYSTEM AND METHOD FOR CREATING A DESIGN TOOL USING A CLOCKWISE FILL RULE

(71) Applicant: Rive Inc., San Francisco, CA (US)

(72) Inventor: Christopher Dalton, San Francisco, CA (US)

(73) Assignee: RIVE INC., San Francisco, CA (US)

( * ) Notice: Subject to any disclaimer, the term of this patent is extended or adjusted under 35 U.S.C. 154(b) by 109 days.

(21) Appl. No.: 18/414,428

(22) Filed: Jan. 16, 2024

(65) Prior Publication Data

US 2024/0242403 A1     Jul. 18, 2024

Related U.S. Application Data

(60) Provisional application No. 63/479,939, filed on Jan. 13, 2023.

(51) Int. Cl.
*G06F 30/10*      (2020.01)
*G06T 11/40*      (2006.01)

(52) U.S. Cl.
CPC .............. *G06T 11/40* (2013.01); *G06F 30/10* (2020.01)

(58) Field of Classification Search
CPC ......... G06T 11/203; G06T 11/40; G06F 30/10
See application file for complete search history.

(56) References Cited

U.S. PATENT DOCUMENTS 7,148,897 B2    12/2006  Ecob
7,952,580 B1     5/2011  Yhann

| | | |
|---|---|---|
| 8,243,070 B1 | 8/2012 | Brown |
| 8,773,432 B2 | 7/2014 | Brown |
| 9,330,495 B2 | 5/2016 | Goel et al. |
| 2004/0207642 A1 | 10/2004 | Crisu |
| 2004/0233210 A1 | 11/2004 | Hancock |
| 2007/0103475 A1 | 5/2007 | Huang |
| 2011/0285740 A1 | 11/2011 | Kilgard |

(Continued)

OTHER PUBLICATIONS

Brown, Sue. "Wilcom E4 Check out These New Elements! Motifs Will Never Be the Same!" YouTube, OML Embroidery, Mar. 15, 2019, www.youtube.com/watch?v=BAi1LqrpYNg. (Year: 2019).*

(Continued)

*Primary Examiner* — Kee M Tung
*Assistant Examiner* — Nauman U Ahmad
(74) *Attorney, Agent, or Firm* — PATENT LAW WORKS LLP

(57)     ABSTRACT

A system and method for creating a design tool using a clockwise fill rule are disclosed. The system creates a design tool for use in an editor, implemented as a feature of application on a server. The design tool provides a user interface allowing a user to create a path of contours using the design tool. For each contour, the design tool provides an interface function to categorize the contour as either a "hole" or a "fill." For contours designated as "hole," the design tool automatically orders the points in a counterclockwise fashion, without user interaction. For contours designated as "fill," the design tool automatically orders the points in a clockwise fashion, without user interaction. In instances where a contour has self-intersections resulting in regions with both clockwise and counterclockwise winding, the design tool orders the points so the majority of an area of the contour winds in a desired direction.

20 Claims, 8 Drawing Sheets

500

User Creates a Path Made of Contours Using the Editor
502

The Editor Provides an Interface for the User to Categorize Each Contour as a "Hole" or "Fill"
504

For "Hole" Contours, The Editor Automatically Orders the Points in a Counterclockwise Fashion Without the User Having to Think About It
506

For "Fill" Contours, The Editor Automatically Orders the Points in a Counterclockwise Fashion Without the User Having to Think About It
508

If a Contour Has Self-intersections (Resulting in Regions with Both Clockwise and Counterclockwise Winding), the Editor Orders the Points Such That the Majority of the Area of the Contour Winds in the Desired Direction
510

Renderer Fills the Regions of the Resulting Path Where the Winding Number is Positive
512

(56) References Cited

U.S. PATENT DOCUMENTS

| | | | |
|---|---|---|---|
| 2013/0104036 A1* | 4/2013 | Nordback | G06T 11/203 |
| | | | 715/247 |
| 2014/0043342 A1* | 2/2014 | Goel | G06T 9/00 |
| | | | 345/501 |
| 2015/0062142 A1 | 3/2015 | Goel et al. | |
| 2015/0077420 A1* | 3/2015 | Bolz | G06T 11/203 |
| | | | 345/442 |
| 2017/0316604 A1 | 11/2017 | Yang | |
| 2019/0057536 A1 | 2/2019 | Fenney | |
| 2019/0108663 A1 | 4/2019 | Batra | |

OTHER PUBLICATIONS

America, Wilcom. "New EmbroideryStudio E4 Designing Element: Spiral Fills." YouTube, YouTube, May 8, 2017, www.youtube.com/watch?v=RebNFgzFRk8. (Year: 2017).*

Google Git, "ANGLE_shader_pixel_local_storage.txt" Git at Google, ,https://chromium.googlesource.com/angle/angle/+/HEAD/extensions/ANGLE_shader_pixel_local_storage.txt modified Aug. 18, 2022, 8 pgs.

Kessenich John M et al. OpenGL Programming Guide: The Official Guide to Learning Opengl. Chapter 14, Now That You Know. Addison-Wesley 2017, Version 1.1 https://www.glprogramming.com/red/chapter14.html#name 13. Accessed Oct. 30, 2023. 21 pgs.

Liland, Eivind Lyngsnes, "Path Rasterizer for OpenVG" NTNU Institutt for datateknikk og informasjonsvitenskap, 2007. retrieved on Feb. 1, 2024, https://ntnuopen.ntnu.no/ntnu-xmlui/handle/11250/252871.

Loop, Charles and Blinn, Jim. "Resolution Independent Curve Rendering Using Programmable Graphics Hardware." ACM Transactions on Graphics (Tog) 2005 pp. 1000-1009. https://doi.org/10.1145/1073204.1073303.

PCT International Search Report and Written Opinion, Application No. PCT/US23/81043 Rive Inc. date of mailing Apr. 1, 2024, 7 pgs.

Salomon, Brian, et al. "Path rendering by counting pixel coverage", Technical Disclosure Commons, May 17, 2017, http://www.tdcommons.org/dpubs_series/525, 12 pgs.

Fredriksen, "Pixel Local Storage on ARM Mali GPUs" (2014).

Johnson, Angus. Fill Rule [Online]. Aug. 18, 2022 [Date from Wayback Machine. Retrieved on Sep. 18, 2025]. Retrieved from the Internet: URL: https://www.angusj.com/clipper2/Docs/Units/Clipper/Types/FillRule.htm (Year: 2022).

Wang et al. Decoupled Coverage Anti-Aliasing [Online]. Aug. 7, 2015 [Retrieved on Sep. 22, 2025]. Retrieved from the Internet: URL: http://dl.acm.org/doi/pdf/10.1145/2790060.2790068 (Year: 2015).

* cited by examiner

200

300

400

500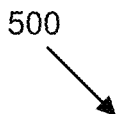

| User Creates a Path Made of Contours Using the Editor |
| :---: |
| 502 |

↓

| The Editor Provides an Interface for the User to Categorize Each Contour as a "Hole" or "Fill" |
| :---: |
| 504 |

↓

| For "Hole" Contours, The Editor Automatically Orders the Points in a Counterclockwise Fashion Without the User Having to Think About It |
| :---: |
| 506 |

↓

| For "Fill" Contours, The Editor Automatically Orders the Points in a Counterclockwise Fashion Without the User Having to Think About It |
| :---: |
| 508 |

↓

| If a Contour Has Self-intersections (Resulting in Regions with Both Clockwise and Counterclockwise Winding), the Editor Orders the Points Such That the Majority of the Area of the Contour Winds in the Desired Direction |
| :---: |
| 510 |

↓

| Renderer Fills the Regions of the Resulting Path Where the Winding Number is Positive |
| :---: |
| 512 |

SYSTEM AND METHOD FOR CREATING A DESIGN TOOL USING A CLOCKWISE FILL RULE

CROSS REFERENCE TO RELATED APPLICATIONS

This application claims priority under 35 USC § 119(e) to the provisional U.S. Application No. 63/479,939 titled "Clockwise Fill Rule" and filed on Jan. 13, 2023, wherein the entirety of the provisional application is herein incorporated by reference.

BACKGROUND

1. Field of the Invention

The present invention relates generally to the field of interactive computer graphics. More particularly, the present invention relates to a system, methods, and processes for creating a design tool that uses a clockwise fill rule. This design tool enables a user to quickly design and edit and send an instruction for rendering the design quickly.

2. Description of the Related Art

Interactive graphics refers to a computer graphics system that allows users or operators to interact with the graphical information presented on a display of a computing device, using one or more of a number, of input devices, some of which are aimed at delivering positions relevant to the information being displayed. Almost all computer workstations and personal systems are now able to be used interactively. An interactive graphic is a way to present data to users who visit a page containing animations and customizations, creating a unique experience for those who wish to review specific information. Therefore, instead of just presenting a fixed frame, the system enables each user to interact with the images displayed in any way they want. Interactive graphics may be applications on their own or alternatively, may be embedded within applications. They may contain multiple forms of images, such as photography, video, and illustrations, and typically incorporate principles of successful image design as well as design and presentation of appropriate controls. Interactive graphics are used to configure images, in myriad applications, including teaching tools, educational games, wherein input and feedback are key to engagement, in demos, simulations, or the like. Interactive graphics provide an opportunity to manipulate things and see results.

It is well known to those skilled in the art that path rendering is a style of resolution-independent two-dimensional ("2D") rendering, often referred to as "vector graphics," which is the basis for a number of important rendering standards such as PostScript, Java 2D, Apple®'s Quartz 2D, OpenVG, PDF, TrueType fonts, OpenType fonts, PostScript fonts, Scalable Vector Graphics (SVG) web format, Microsoft®'s Silverlight® and Adobe® Flash for interactive web experiences, Open XML Paper Specification (OpenXPS), drawings in Office file formats including PowerPoint®, Adobe® Illustrator illustrations, and more. Path rendering is resolution-independent meaning that a scene is described by paths without regard to the pixel resolution of the framebuffer. It will also be recognized by those skilled in the art, that this is in contrast to the resolution-dependent nature of so-called bitmapped graphics. Whereas bitmapped images exhibit blurred or pixelated appearance when zoomed or otherwise transformed, "scenes" specified with path rendering can be rendered at different resolutions or otherwise transformed without blurring the boundaries of filled or stroked paths.

As recognized by those skilled in the art, sometimes the term "vector graphics" is used to mean path rendering, but path rendering is a more specific approach to computer graphics. Although "vector graphics" may refer to any computer graphics approach that represents objects (typically 2D) in a resolution-independent way, path rendering is a much more specific rendering model with salient features that include path filling, path stroking, dashing, path masking, compositing, and path segments typically specified as Bèzier curves. It should also be recognized by those skilled in the art that Bézier curves are used in computer graphics to produce curves which appear reasonably smooth at all scales (as opposed to polygonal lines, which will not scale nicely). Mathematically, they are a special case of cubic Hermite interpolation (whereas polygonal lines use linear interpolation).

In the context of vector graphics, a path is a set of contours that may overlap. A contour is a closed loop composed of a series of connected lines and curves. A path may contain zero, one, or more contours. In addition, the winding number for a path at any point is the sum of winding numbers from each contour at that point.

With the increasing need for high performance graphics in every realm of digital life, there is a continuing need for improved editing systems, methods, and tools.

SUMMARY

The present technology overcomes the deficiencies and limitations of prior systems and methods used for creating designs with computer graphics, at least in part, by providing an improved system and methods for creating design tools with clockwise fill rules that are effective, efficient, and seamless for developers and other users to use to create high performance interactive graphics. In some embodiments, the present invention may be embodied as editing tools or features for computer graphics and provided to users or developers via a software-as-a-service ("SAS") product that users or developers may use to create computer graphics. In some embodiments, users may use these software graphic tools to build interactive animations that can run anywhere. These interactive graphics builder tools provide a new graphics format configured to nimbly react, animate, and change itself in any instance.

In accordance with some aspects, the present invention provides an improved system and methods for creating design tools with clockwise fill rules that are effective, efficient, intuitive, and seamless for developers and other users to use to create high performance interactive graphics. The design tools may be used in an "editor" implemented as a feature of application on a server. In some embodiments, the editor in accordance with the present invention provides an interface to a user who creates a path of contours using the editor. For each contour, the editor is configured to provide an interface function for the user to categorize each contour as either a "hole" or a "fill." For contours designated as "hole," the editor is configured to automatically place in order the points in a counterclockwise fashion, without requiring user thought or input. In some embodiments, for contours designated as "fill," the editor automatically places in order the points in a clockwise fashion without requiring user thought or input. In instances where the counter has self-intersections, resulting in regions that have both clockwise and counterclockwise winding, the editor tool places in order the points such that the majority of the area of the contour winds in the desired direction.

In some embodiments, the editor provides instructions to the renderer to fill the regions of the resulting path where the winding number is positive.

Additional details are described below in the detailed description.

BRIEF DESCRIPTION OF THE DRAWINGS

The present invention is illustrated by way of example, and not by way of limitation in the figures of the accompanying drawings in which like reference numerals are used to refer to the same or similar elements.

FIG. 5 is a flow chart of the method for creating a design tool in accordance with the present invention.

DETAILED DESCRIPTION

Figure 1:
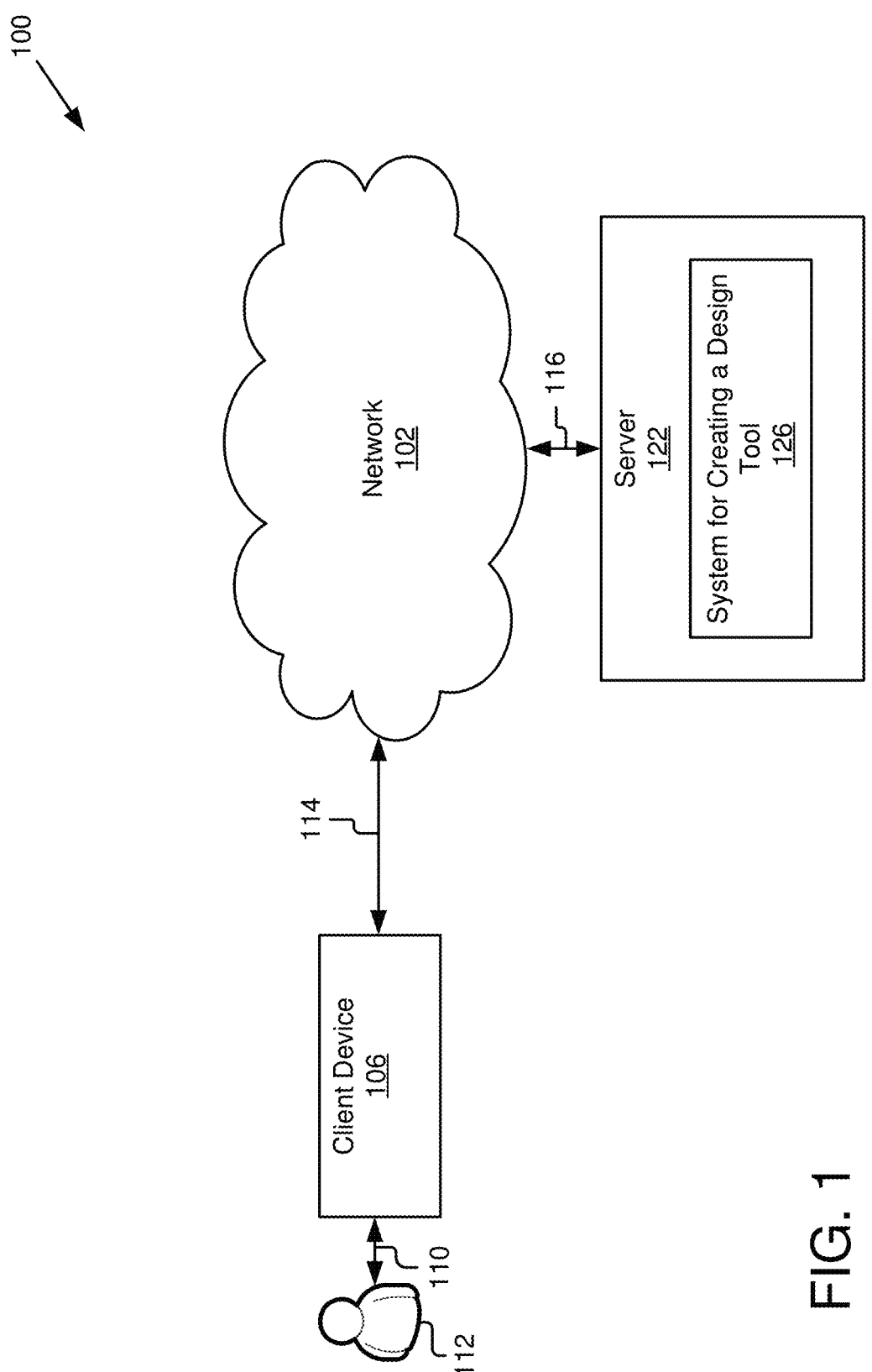
FIG. 1 is a high-level block diagram, illustrating an example environment in which the present invention is embodied as software tools in a system for creating or building design or editing tools for interactive computer graphics.

In the following description, numerous specific details are set forth to provide a more thorough understanding of the various embodiments of the present invention. However, it will be apparent to one of skill in the art that the present invention may be practiced without one or more of these specific details. In other instances, well-known features have not been described in order to avoid obscuring the present invention.

The present invention is directed to a design or editing tool, which is a seamless solution in building two-dimensional computer graphics. Two-dimensional computer graphics are widely used in animation and video games, providing a realistic, but flat, view of movement on the screen. The present invention is a novel tool that may be used as a feature in an editor or editing application.

In the following description, for purposes of explanation, numerous specific details are set forth in order to provide a thorough understanding of this technology. It will be apparent, however, that this technology can be practiced without some of these specific details. In other instances, structures and devices are shown in block diagram form in order to avoid obscuring the innovative aspects of the present invention. For example, the present technology is described in some implementations below with reference to particular hardware and software.

Various aspects of the present disclosure may be embodied as a method, a system, or a non-transitory, computer readable storage medium having one or more computer readable program codes stored thereon. Accordingly, various embodiments of certain components of the present disclosure described may take the form of an entirely hardware embodiment, an entirely software embodiment comprising, for example, microcode, firmware, software, etc., or an embodiment combining software and hardware aspects that may be referred to herein as a "system," a "module," an "engine," a "circuit," or a "unit."

Reference in this specification to "one implementation or embodiment" or "an implementation or embodiment" simply means that a particular feature, structure, or characteristic described in connection with the implementation or embodiment is included in at least one implementation or embodiment of the technology described. The appearances of the phrase "in one implementation or embodiment" in various places in the specification are not necessarily all referring to the same implementation or embodiment.

Some portions of the detailed descriptions that follow are presented in terms of algorithms and symbolic representations of operations on data bits within a computer memory. These algorithmic descriptions and representations are the means used by those knowledgeable in the data processing arts to most effectively convey the substance of their work to others in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing" or "computing" or "calculating" or "determining" or "displaying" or the like, refer to the action and processes of a computer system, or similar electronic computing device (such as or including the computer/processor), that manipulates and transforms data represented as physical (electronic) quantities within the computer system's registers and memories (such as or including the memory and data storage) into other data similarly represented as physical quantities within the computer system memories or registers or other such information storage, transmission or display devices.

The unique solutions and processing techniques of the present invention are embodied in a graphics processing unit ("GPU") with a modern architecture for rasterization. A GPU herein refers to a graphics processing unit, which is any specialized processor designed to accelerate graphics rendering. As is known to those skilled in the art, GPUs can process many pieces of data simultaneously, making them useful for application in creative production, video editing, gaming applications, and machine learning. A GPU may be integrated into a computer's CPU or be a discrete hardware unit. A GPU enables parallel processing, is flexible and programmable, allowing graphics developers to create more interesting visual effects and realistic and desired scenes. GPUs makes it faster and easier to render video and graphics in high-definition formats. A single GPU shader referred to herein, is code that is executed on the GPU, typically found on a graphics card, to manipulate an image before it is drawn to the screen or display. Shaders permit various kinds of rendering effect, ranging from adding an X-ray view to adding outlines to rendering output.

FIG. 1 illustrates a user 112 at a client device 106 (illustrated by two-way signal line 110 coupling the two), which interacts with a system for creating a design tool referenced by reference numeral 126, in a server 122. The client device 106 communicates with the system for creating a design tool via signal lines 114 and 116 and a network 102.

Figure 2:
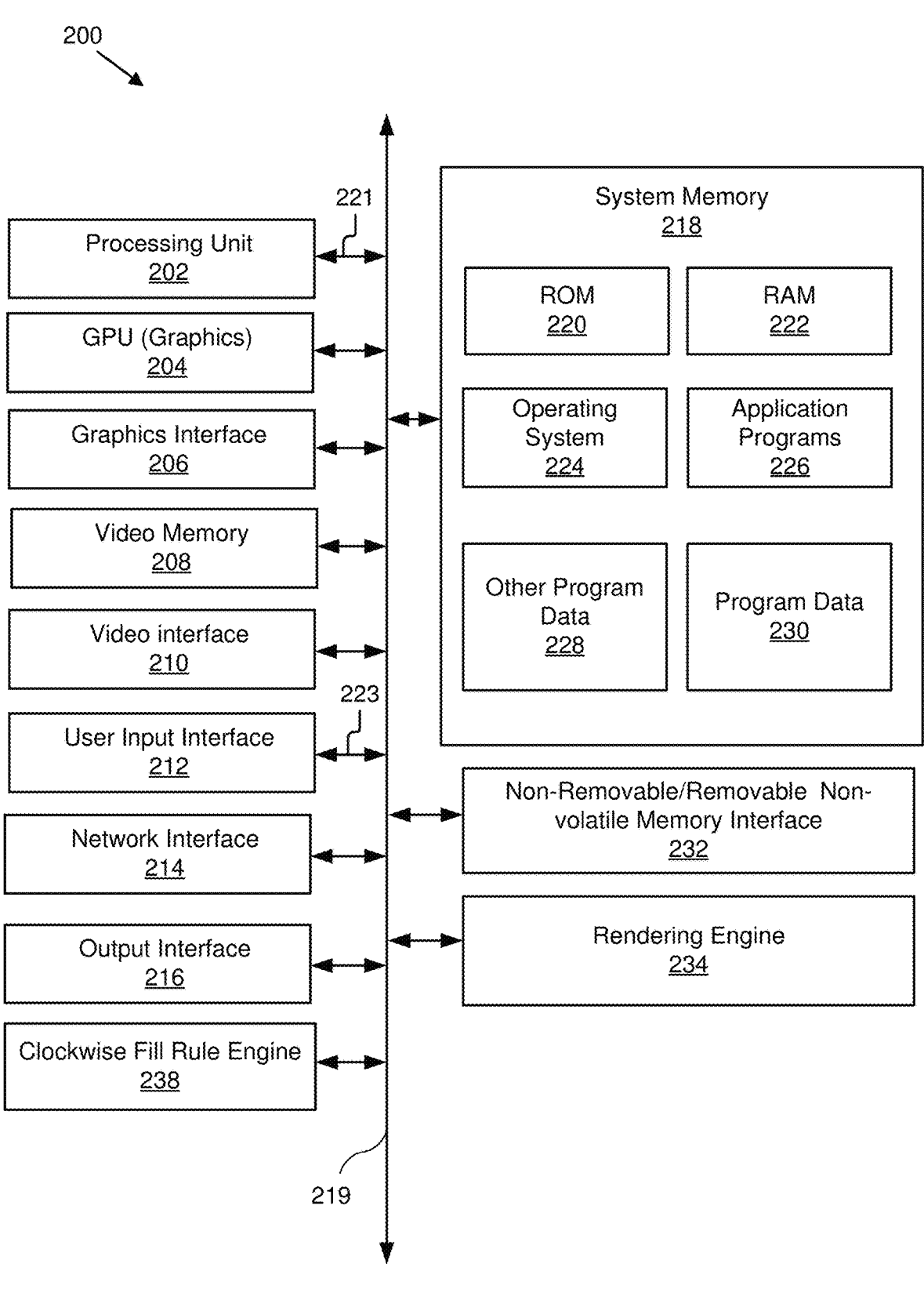
FIG. 2 is a high-level block diagram illustrating example hardware and software components in interactive computer graphics systems.

FIG. 2 illustrates a block diagram of an example computer system 200 configured to implement one or more aspects of the present invention. Computer system 200 may include a processing unit (e.g., a CPU) 202 and a graphical processing unit (GPU) 204, as described above. The computer system 200 further includes a video memory 208, a video interface 210, a user input interface 212, a network interface 214, an output interface 216, a system memory 218, a non-removable/removable non-volatile memory interface 232, and a rendering engine 234. The rendering engine 234 is illustrated separately for purpose of illustration, but may be configured as part of the GPU 204 or provided as a subsystem coupled to the GPU 204. The system 200 further comprises a clockwise fill rule engine 238 that is illustrated separately for purpose of illustration, but may be configured as part of the GPU 204 or provided as a subsystem coupled to the GPU 204.

The processing unit 202 as illustrated is a computer or data processing system suitable for storing and/or executing program or executable code in any of the modules or units described here. In some embodiments, the system memory 218 may communicate via an interconnection path 219, which in some embodiments may include a memory bridge 221, connected via a bus or other communication path to an I/O (input/output) bridge in the user input interface 212. In some embodiments, the I/O bridge may be a Southbridge chip. The I/O bridge is configured to receive user input from one or more user input devices (e.g., keyboard or mouse) and forward input to the processing unit 202 via a bus and/or the memory bridge 221. In some embodiments, the memory bridge 221 may be a Northbridge chip. As is recognized by those skilled in the art, parallel processing subsystems 223 (320 in FIG. 3) may be coupled to the memory bridge 221 via the bus or other communication path. Examples include a PCI Express, Accelerated Graphics Port, or a HyperTransport link. It some embodiments, the parallel processing systems designated by reference numeral 223 may be graphics subsystems that deliver pixels to a display device, for example, a CRT or LCD based monitor. A system disk may be connected to the I/O bridge. A switch may be configured to provide connections between the I/O bridge and other components such as network adaptor and various add-in cards. Other components including USB or other port connections, CD drives, DVD drives, film recording devices, or the like, may also be connected to the I/O bridge. Communication paths interconnecting the various components illustrated may be implemented by suitable protocols, such as PCI (Peripheral Component Interconnect), PCI-Express, AGP (Accelerated Graphics Port), HyperTransport, or any other bus or point-to-point communication protocol and connections between different devices as is known in the field.

In some embodiments, the parallel processing subsystems 223 may incorporate circuitry optimized for graphics and video processing, including, but not limited to, video-output circuitry, and other graphics processing units (GPU). In some embodiments, the parallel processing subsystems 223 may incorporate circuitry optimized for general processing, while preserving the underlying computational architecture.

Figure 4:
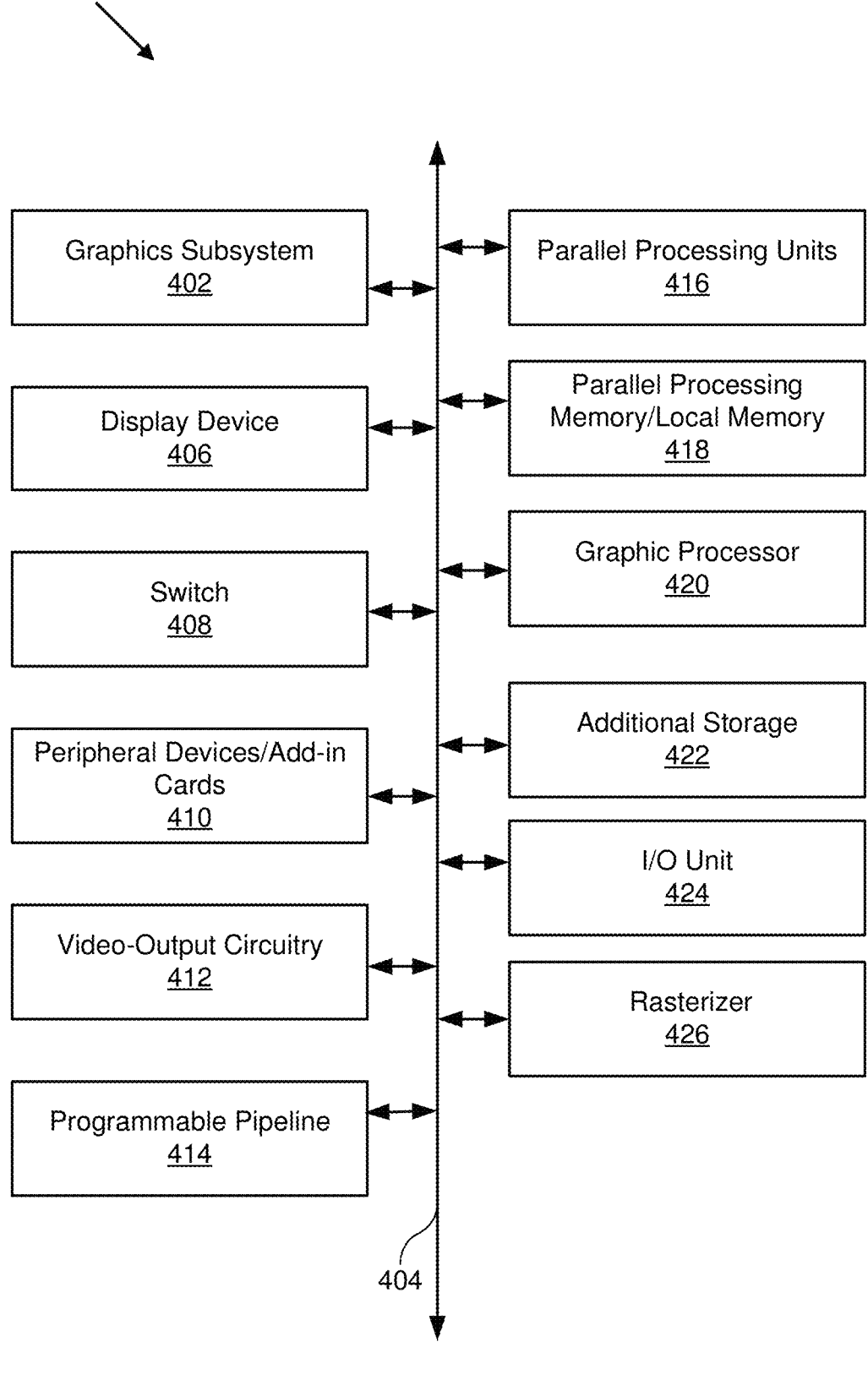
FIG. 4 is a high-level block diagram illustrating example hardware and software components of the present invention in accordance with some embodiments of the invention.

The particular GPU 204, as illustrated, represents a specialized electronic circuit designed to manipulate and alter memory to accelerate the creation of images in a frame buffer intended to output to a display device (406 in FIG. 4). As is recognized by those skilled in the art, GPUs are embedded systems that may be used on mobile phones, personal computers, workstations and game consoles. It will also be recognized by those skilled in the art that GPUs are also referred to as graphics cards or video cards. Every PC uses a GPU to render images, video, 2D, and 3D animations for display. The GPU is configured to perform quick mathematical calculations and free up the CPU 202 for other tasks. Typically, the CPU uses a few cores focused on sequential serial processing and the GPU 204 comprises thousands of smaller cores configured for multi-tasking. It will be recognized by those skilled in the art that there are two different types of GPUs, namely, integrated GPUs, which are located on a personal computer's CPU and share memory with the CPU's processor and discrete GPUs that are a graphics card with its own video memory (VRAM), so that the personal computer does not have to use its RAM for graphics operations.

In some embodiments, the system memory 218 is a non-transitory, computer-readable storage medium. As used herein. "non-transitory computer-readable storage medium" refers to all computer-readable media, for example, non-volatile media, volatile media, and transmission media, except for a transitory, propagating signal. Non-volatile media comprise, for example, solid state drives, optical discs or magnetic disks, and other persistent memory volatile media including a dynamic random-access memory (DRAM), which typically constitute a main memory. Volatile media comprise, for example, a register memory, a processor cache, a random-access memory (RAM), etc. Transmission media comprise, for example, coaxial cables, copper wire, fiber optic cables, modems, etc., including wires that constitute a system bus coupled to the CPU 202. The CPU 202 is operably and communicatively coupled to the system memory 218 for executing the computer program instructions defined by modules, for example, any of the modules described here. The system memory 218 is used for storing program instructions, the operating system 224, application programs 226, other program data 228 and program data 230. The memory 218 comprises, for example, a read-only memory (ROM) 220, a random-access memory (RAM) 222, or another type of dynamic storage device that stores information and instructions for execution by the processing unit 202.

Figure 3:
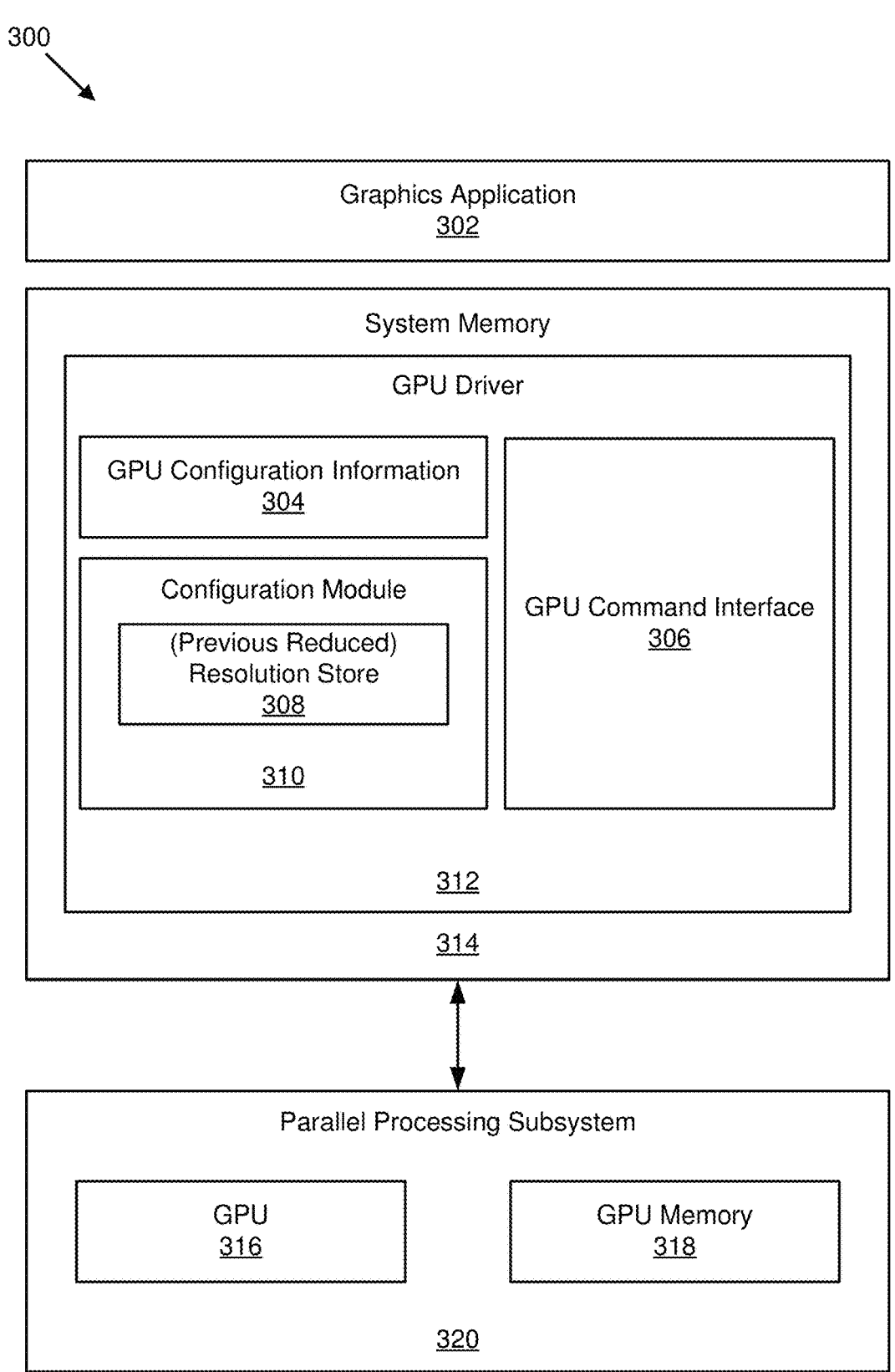
FIG. 3 is an example architecture of a graphics application and system memory.

Referring now to FIG. 3, which illustrates a more detailed view of the system memory 314, as shown, the parallel processing subsystem 320 includes a GPU 316 and a GPU memory 318. The GPU 316 is a graphics processor with a rendering pipeline that can be configured to perform various tasks related to rendering frames for display from graphics data supplied by the CPU and/or the system memory. The GPU 316 interacts with the GPU memory 318 to store and update pixel data and rendered frames, delivers pixel data to the display device, and the like. In some embodiments, the parallel processing subsystem 320 may include one or more GPUs 316 that operate as graphics processors and one or more other GPUs that are used for general-purpose computations. Also as depicted, the system memory 314 includes a graphics application 302 and a GPU driver 312. The graphics application 302 is a software program that, among other things, produces graphics data for rendering frames for display on the display device. For rendering of a particular frame, the graphics application 302 transmits a graphics rendering command stream associated with the particular frame to the GPU driver 312. The graphics rendering command stream includes graphics data associated with the particular frame and the rendering command that specified a nominal resolution at which the particular frame should be rendered. The nominal resolution specified by the rendering command relates to the display configuration of the display device.

The GPU driver 312 is an interface layer between the GPU and the graphics application 302. As illustrated, the GPU driver 312 includes the GPU configuration information 304 and a GPU command interface 306. The GPU configuration information 304 stores configuration information associated with the GPU 316. The stored configuration information may be user-defined or may be pre-configured, and among other things, specifies whether the interleaving functionality for reduced frame rendering is active. It should be recognized by those skilled in the art that the interleaving functionality for reduced frame rendering allows the GPU 316 to render consecutive frames at complementary reduced resolutions, thereby decreasing the computational load on the GPU.

As shown, the GPU driver 312 also includes a configuration module 310. The configuration module 310 configures the graphics rendering command streams received from the graphics application 302 to activate the interleaving functionality to implement reduced frame rendering or any rendering. The configuration module 310 includes a resolution store 308 with information on resolution, for example if previously reduced. The resolution store 308 stores the resolution associated with an immediately preceding graphics rendering command stream configured to implement frame rendering (for example, reduced).

In operation, when a graphics rendering command stream associated with a particular frame is received from the graphics application 302, the GPU command interface first determines, based on configuration information stored in the GPU configuration information, whether the interleaving functionality to implement reduced frame rendering is active. If the interleaving functionality for reduced frame rendering is inactive, then the GPU command interface transmits the graphics rendering command stream to the GPU for conventional processing. If, however, the interleaving functionality for reduced frame rendering is active, then the GPU command interface transmits a notification to the configuration module 310 that causes the configuration module to configure the graphics rendering command stream to adjust and implement frame rendering as designated (reduced or not).

Persons skilled in that art would recognize that any type of data reduction across two or more frames. i.e., the complementary frames, falls within the scope of the present invention. For example, three complementary frames may be reduced in the color dimension, where a first complementary frame has reduced rendering for the color red, a second complementary frame has reduced rendering for the color green, and a third complementary frame has reduced rendering for the color blue. As another example, the complementary frames may be reduced along the diagonal, where a first complementary frame has reduced rendering along an upper-side of the diagonal and the second complementary frame has reduced rendering for the lower-side of the diagonal. As yet another example, the intermediary data used for rendering the complementary frames may be reduced. In such a scenario, texture data in texture maps, shadow data stored in shadow maps or data stored in any other map used for rendering the complementary frames may be reduced.

Persons skilled in the art also would recognize that complementary frames do not necessarily have to be consecutive frames. For example, any two frames in a series of three consecutive frames could be complementary frames.

Referring now to FIGS. 1, 2 and 4, the GPU 204 is configured to render images more quickly than a CPU 202 because of its parallel processing architecture, which allows it to perform multiple calculations across streams of data simultaneously. This GPU 204 architecture comprises parallel processing subsystems (320 in FIG. 3) or cores coupled to the memory bridge via the bus or other communication path 219 (FIG. 2), which may include a graphics subsystem 402 that delivers pixels to a display device 406 (e.g., a conventional CRT or LCD based monitor in FIG. 4). In some embodiments, a system disk may also be connected to the I/O bridge in the user input interface 212. A switch 408 (FIG. 4) is configured to provide connections between the I/O bridge or other communication path in the user input interface 212 and other components such as a network interface 214 and various peripheral devices 410 (e.g., add-in cards in FIG. 4) that may be used. Other components (not explicitly shown), including USB or other port connections, CD drives, DVD drives, film recording devices, and the like, may also be connected to I/O bridge in the user input interface 212. Communication paths interconnecting the various components in FIG. 2 may be implemented using any suitable protocol, such as PCI (Peripheral Component Interconnect), PCI-Express, AGP (Accelerated Graphics Port), HyperTransport, or any other bus or point-to point communication protocols, and connections between different devices may use different protocols as is known in the art.

In some embodiments, the parallel processing subsystems 320 (FIG. 3) in the GPU 204 may incorporate circuitry optimized for graphics and video processing, including, for example, video-output circuitry 412. In another embodiment, the parallel processing subsystems 320 in the GPU 204 incorporate circuitry optimized for general purpose processing, while preserving the underlying computational architecture, described in greater detail herein. In yet another embodiment, the parallel processing subsystem 320 in the GPU 204 may be integrated with one or more other system elements, such as the memory bridge in the system memory 218 (FIG. 2), processing unit 202 (FIG. 2), and I/O bridge in the user input interface 212 (FIG. 2) to form a system on chip ("SoC"). It will be appreciated that the system shown herein is illustrative and that variations and modifications are possible. The connection topology, including the number and arrangement of bridges, the number of processing units 202, and the number of parallel processing subsystems in the GPU 204, may be modified as desired. For instance, in some embodiments, system memory 218 may be connected to the processing unit 202 directly rather than through a bridge, and other devices communicate with system memory 218 via memory bridge and the processing unit 202. In other alternative topologies, parallel processing subsystems in the GPU may be connected to the user input interface 212 or directly to the processing unit 202, rather via a memory bridge. In still other embodiments, the user input interface 212 and memory components may be integrated into a single chip. Large embodiments may include two or more processing units 202 and two or more parallel processing systems in the GPU 204. The particular components shown herein are optional and illustrative; for instance, any number of add-in cards or peripheral devices may be integrated and supported.

It should be recognized that graphics hardware has evolved from a fixed function to a programmable pipeline 414. The programmable pipeline 414 is based on vertex and pixel shaders. A vertex shader program (stored in other program data 228 in FIG. 2) executes on each vertex of a graphics primitive, while a pixel shader program (also stored in other program data 228 in FIG. 2) executes on every pixel of a rasterized triangle. The data encapsulated in a vertex may be a user defined collection of floating-point numbers, much like a C struct (program data 230 in FIG. 2). The vertex shader program may modify this, or invent new data, and pass the result along to a pixel shader. The input to a pixel shader is an interpolation of the vertex data on the vertices of a triangle. This interpolation is non-linear, involving the projective transform that maps a triangle from model to screen space. The pixel shader can output a color value that is written to the frame buffer.

The parallel processing subsystems 320 (FIG. 3) in the GPU 204 may include one or more parallel processing units 416 (FIG. 4), each of which may be coupled to a local parallel processing memory 418. In a typical architecture, a parallel processing subsystem 320 may include a number of parallel processing units 416. The parallel processing units 416 and the parallel processing memories (local memory 418) may be implemented using one or more integrated circuit devices, such as programmable processors, application specific integrated circuits (ASICs), or memory devices, or in any other technically feasible fashion.

In some embodiments, some or all of the parallel processing units 416 in parallel processing subsystem 320 are graphics processors 420 with rendering pipelines that may be configured to perform various tasks related to generating pixel data from graphics data supplied by CPU 202 and/or system memory 218, interacting with local parallel processing memory 418 (which can be used as graphics memory including, e.g., a conventional frame buffer) to store and update pixel data, delivering pixel data to display devices, and the like. In some embodiments, the parallel processing subsystem in the GPU 204 may include one or more parallel processing units 416 that operate as graphics processors 420 and one or more other parallel processing units 416 that may be used for general-purpose computations. The parallel processing units 416 may be identical or different, and each parallel processing unit 416 may have its own dedicated parallel processing memory device 418 or no dedicated parallel processing memory device 418 and may use a shared memory (e.g., the system memory 218 in FIG. 1). One or more parallel processing units 416 may output data to the display device 406 or each parallel processing unit 416 may output data to one or more display devices 406.

In operation, the processing unit 202 may serve as the "master" processor of computer system 200, controlling and coordinating operations of other system components. In particular, the processing unit 202 may execute commands that control the operation of the parallel processing units 416 (FIG. 4). In some embodiments, the processing unit 202 may write a stream of commands for each parallel processing units 416 to a pushbuffer (not explicitly shown) that may be located in system memory 218, parallel processing memory 418, or another storage location 422 accessible to both the processing unit 202 and the parallel processing units 416 in the GPU 204. The parallel processing units 416 (in GPU 204) read the command stream from the pushbuffer and then execute commands asynchronously relative to the operation of the processing unit 202. Each parallel processing unit 416 may include an I/O (input/output) unit 424 configured to communicate with the other components in the computer system 400 via a communication path, which may connect to a memory bridge (or, in one alternative embodiment, directly to processing unit 202). The connection of the parallel processing units 416 to the other parts of the computer system 400 may also vary.

In one embodiment, the communication path may be a PCI EXPRESS link, in which dedicated lanes are allocated to each PPU, as is known in the art. Other communication paths may also be used. The I/O unit 424 generates packets (or other signals) for transmission on communication path and also receives all incoming packets (or other signals) from communication path 404, directing the incoming packets to appropriate components of parallel processing units 416. Each parallel processing unit 416 advantageously implements a highly parallel processing architecture. Each parallel processing unit 416 may include a processing cluster array that includes a number C of general processing clusters (GPCs). Each GPC is capable of executing a large number (e.g., hundreds or thousands) of threads concurrently, where each thread is an instance of a program. In various applications, different GPCs may be allocated for processing different types of programs or for performing different types of computations. For example, in an example graphics application, a first set of the allocation of GPCs may vary dependent on the workload arising for each type of program or computation. GPCs are configured to receive processing tasks to be executed via a work distribution unit, which may receive commands defining processing tasks from a front-end unit. Processing tasks may include indices of data to be processed, e.g., surface (patch) data, primitive data, vertex data, and/or pixel data, as well as state parameters and commands defining how the data is to be processed (e.g., what program is to be executed). Work distribution units may be configured to fetch the indices corresponding to the tasks, or work distribution units may receive the indices from the front-end unit. The front-end unit ensures that GPCs are configured to a valid state before the processing specified by the pushbuffers is initiated. When the parallel processing units 416 are used for graphics processing, for example, the processing workload for each patch is divided into approximately equal sized tasks to enable distribution of the tessellation processing to multiple GPCs. A work distribution unit may be configured to produce tasks at a frequency capable of providing tasks to multiple GPCs for processing. In some embodiments, portions of GPCs may be configured to perform different types of processing. For example, a first portion may be configured to perform vertex shading and topology generation, a second portion may be configured to perform tessellation and geometry shading, and a third portion may be configured to perform pixel shading in pixel space to produce a rendered image. Intermediate data produced by the GPCs may be stored in buffers to allow the intermediate data to be transmitted between GPCs for further processing.

A memory interface may be configured with partitioned units that are each directly coupled to a portion of parallel processing memory 418. Each partitioned memory may be a RAM or DRAM. Frame buffers or texture maps may be stored across the memory 418, allowing partition units to write portions of each render target in parallel to efficiently use the available bandwidth of parallel processing memory.

Any one of GPCs may process data to be written to any of the DRAMs within parallel processing memory.

In some configurations, a crossbar unit may be configured to route the output of each GPC to the input of any partition unit or to another GPC for further processing. GPCs communicate through the crossbar unit to read from or write to various external memory devices. In one embodiment, crossbar unit has a connection to memory interface to communicate with I/O unit, as well as a connection to local parallel processing memory, thereby enabling the processing cores within the different GPCs to communicate with system memory or other memory that is not local to a PPU. The crossbar unit may use virtual channels to separate traffic streams between the GPCs and partition units. Again, GPCs may be programmed to execute processing tasks relating to a wide variety of applications, including but not limited to, linear and nonlinear data transforms, filtering of video and/or audio data, modeling operations (e.g., applying laws of physics to determine position, Velocity and other attributes of objects), image rendering operations (e.g., tessellation shader, Vertex shader, geometry shader, and/or pixel shader programs), and so on. Parallel processing units 416 may transfer data from system memory 218 and/or local parallel processing memories 418 into internal (on-chip) memory, process the data, and write result data back to system memory 218 and/or local parallel processing memories 418, where such data may be accessed by other system components, including the CPU 202 or another parallel processing subsystem. A parallel processing unit 416 may be provided with any amount of local parallel processing memory 418, including no local memory, and may use local memory and system memory in any combination. For instance, a parallel processing unit 416 may be a graphics processor 420 in a unified memory architecture (UMA) embodiment. In such embodiments, little or no dedicated graphics (parallel processing) memory would be provided, and the parallel processing units 416 may use system memory exclusively or almost exclusively. In UMA embodiments, a particular parallel processing unit 416 may be integrated into a bridge chip or processor chip or provided as a discrete chip with a high-speed link (e.g., PCI-EX-PRESS) connecting the parallel processing units 416 to system memory via a bridge chip or other communication means. As noted above, any number of parallel processing units 416 may be included in a parallel processing subsystem. Parallel processing units 416 in a multi-parallel processing system may be identical to or different from one another. For instance, different parallel processing units 416 may have different numbers of processing cores, different amounts of local parallel processing memory, and so on. Where multiple parallel processing units 416 are present, those parallel processing units 416 may be operated in parallel to process data at a higher throughput than is possible with a single parallel processing unit 416. Systems incorporating one or more parallel processing units 416 may be implemented in a variety of configurations and form factors, including desktop, laptop, or handheld personal computers, servers, workstations, game consoles, embedded systems, and the like.

A graphics processing pipeline (in 414) may be configured to implement and perform the functions of one or more of a Vertex processing unit, a geometry processing unit, and a fragment processing unit. The functions of a data assembler, a primitive assembler, a rasterizer 426, and a raster operations unit may also be performed by other processing engines within a GPC and a corresponding partition unit. Alternately, a graphics processing pipeline 414 may be implemented using dedicated processing units for one or more functions. The data assembler is configured to collect vertex data for high-order surfaces, primitives, and the like, and output the vertex data, including the vertex attributes, to vertex processing unit. The vertex processing unit represents a programmable execution unit that is configured to execute vertex shader programs, lighting and transforming vertex data as specified by the vertex shader programs. For example, the vertex processing unit may be programmed to transform the vertex data from an object-based coordinate representation (object space) to an alternatively based coordinate system such as world space or normalized device coordinates (NDC) space. Vertex processing unit may read data that is stored in L1 cache, parallel processing memory, or system memory by data assembler for use in processing the vertex data. Primitive assembler receives vertex attributes from Vertex processing unit, reading stored vertex attributes, as needed, and constructs graphics primitives for processing by geometry processing unit. Graphics primitives may include triangles, line segments, points, and the like. Geometry processing unit is a programmable execution unit that is configured to execute geometry shader programs, transforming graphics primitives received from primitive assembler as specified by the geometry shader programs. For example, geometry processing unit may be programmed to subdivide the graphics primitives into one or more new graphics primitives and calculate parameters, such as plane equation coefficients, that are used to rasterize the new graphics primitives. In some embodiments, geometry processing unit may also add or delete elements in the geometry stream. Geometry processing unit outputs the parameters and vertices specifying new graphics primitives to a viewport scale, cull, and clip unit. Geometry processing unit may read data that is stored in parallel processing memory or system memory for use in processing the geometry data. Viewport scale, cull, and clip unit performs clipping, culling, and viewport Scaling and outputs processed graphics primitives to the rasterizer 426.

The rasterizer 426 scans and converts the new graphics primitives and outputs fragments and coverage data to fragment processing unit. Additionally, the rasterizer 426 may be configured to perform Z culling and other Z-based optimizations. Fragment processing unit is a programmable execution unit that is configured to execute fragment shader programs, transforming fragments received from the rasterizer 426 as specified by the fragment shader programs. For example, the fragment processing unit may be programmed to perform operations such as perspective correction, texture mapping, shading, blending, and the like, to produce shaded fragments that are output to raster operations unit. Fragment processing unit may read data that is stored in parallel processing memory or system memory for use in processing the fragment data. Fragments may be shaded at pixel, sample, or other granularity, depending on the programmed sampling rate. Raster operations unit is a processing unit that performs raster operations, such as stencil, Z test, blending, and the like, and outputs pixel data as processed graphics data for storage in graphics memory. The processed graphics data may be stored in graphics memory, e.g., parallel processing memory 418, and/or system memory 418, for display on a display device 406 or for further processing by the processing unit 202 or parallel processing subsystem 320. In some embodiments of the present invention, raster operations unit is configured to compress Z or color data that is written to memory and decompress Z or color data that is read from memory.

Referring now to FIG. 5, the flow chart represents the functions implemented to create and execute the design or editing tool in accordance with the present invention. This system and editor introduce a design solution involving a new fill rule (implemented in the clockwise fill rule engine 238), that is seamless for designers in executing. The process 500 begins at block 502, including one or more operations for presenting an interface to users. The user creates a path made of contours using the editor tool (or design tool) described above. The process 500 proceeds to the next block 504, including one or more operations for, considering each contour, and providing an interface for the user to categorize or designate each contour as either a "hole" or a "fill." In the instance of a contour that is designated a "hole," the process 500 proceeds to the block 506, including one or more operations by which the editor automatically orders the points in a counterclockwise fashion, without user thought, action, or input. In the instance of a contour that is designated or categorized as a "fill," the process proceeds to the next block 508, including one or more operations, whereby the editor automatically orders the points in a clockwise fashion without the user having to give thought, take action or provide input. Thus, contours designated as fills are ordered clockwise while contours designated as holes are ordered counterclockwise, enabling the renderer to distinguish filled regions from holes using a positive winding number rule. The process 500 proceeds to the next block 510, including one or more operations, whereby if the contour has self-intersections that may result in regions with both clockwise and counterclockwise winding, the editor orders the points such that the majority of the area of the contour winds in the desired direction. The process 500 continues to the next block 512, including one or more operations, whereby the editor informs the rendering engine 234 (or renderer 234), by providing the processed path data (with points ordered as holes or fills), which fills the regions of the resulting path where the winding number is positive.

Figure 6:
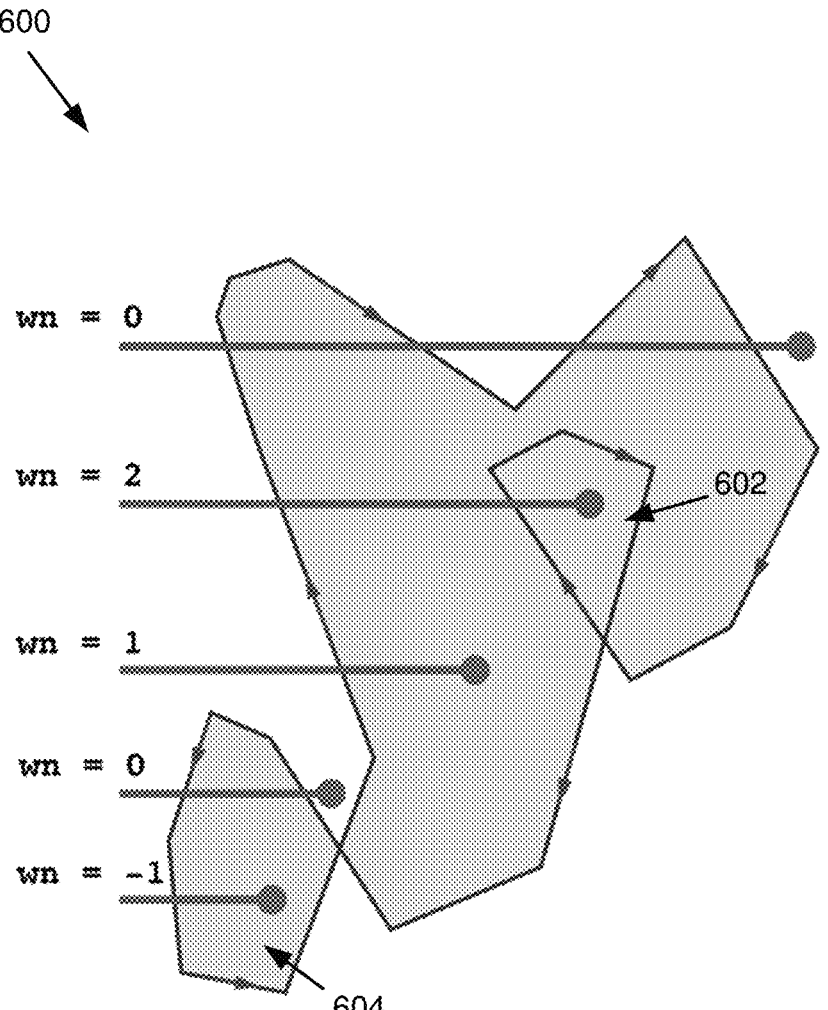
FIG. 6 is a graphical representation illustrating how every region of a path is assigned an integer winding number, based on how many loops cover the designated area, and whether the surrounding loops are clockwise or counterclockwise.

Referring now to FIG. 6, which illustrates the "Clockwise Fill Rule," the region in which the winding number is "2" is indicated by reference numeral 602, and the region in which the winding number is "−1" is indicated by reference numeral 604. The system assigns an integer winding number ("wn") to every region of a path, based on how many loops cover that area, and whether the surrounding loops are clockwise or counterclockwise. It will be recognized by those skilled in the art that in mathematics, the winding number or winding index of a closed curve in the plane around a given point is an integer representing the total number of times that curve travels clockwise around the point, i.e., the curve's number of turns. The winding number depends on the orientation of the curve, and it is positive if the net number of turns around the point is determined to be clockwise, or negative if the net number of turns is counterclockwise. It should be recognized that in vector graphics, every path is closed and every winding number is an integer. A path's fill rule determines whether or not a region should be filled, based on the winding number. In traditional vector graphics, there are two different rules for determining which region should be filled. The first is that any region with a winding number that is nonzero is filled. The second is that any region with a winding number that is odd is filled. In accordance with the present invention, a new fill rule referred to as "clockwise" is introduced. Any region with a winding number that is positive is filled. It will be recognized by those skilled in the art that existing vector graphics fill rules are difficult and nonintuitive for designers. The new "clockwise" fill rule executed by the present invention creates a seamless design experience for users that is easier. Clockwise regions are filled and counterclockwise regions are "black holes" that erase clockwise loops. In some embodiments, the editor can go beyond its capability and hide the clockwise/counterclockwise details from the designer. Instead, the designer can easily designate each contour within a path as a "fill" or a "hole," and the editor automatically emits the points of those contours in a clockwise or counterclockwise order. It should be recognized that self-intersecting contours, though rare, are not as simple because they have both clockwise and counterclockwise regions. In such case, the editor is configured to simply determine the dominant winding direction of the contour (based on its signed area) and order the points in such a way that the majority of the contour matches the designer's designation ("hole" or "fill").

Figure 7:
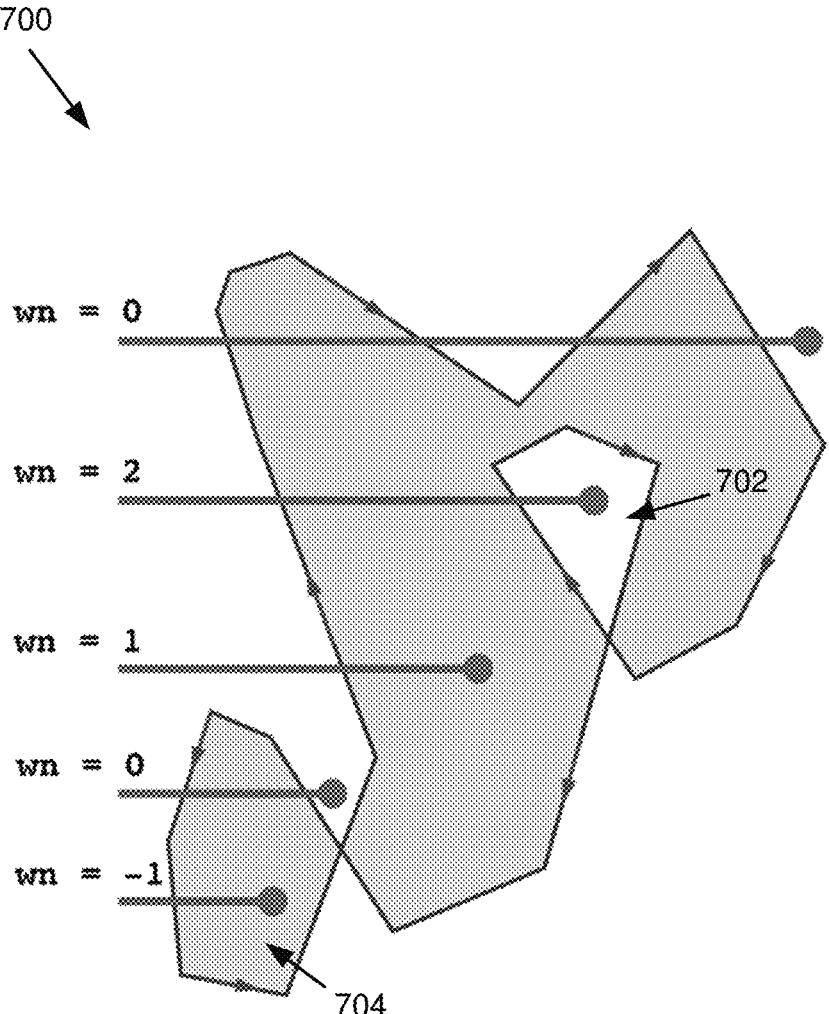
FIG. 7 is a graphical representation illustrating the even-odd fill rule, in which the region with the winding number that equals two is not filled.
Figure 8:
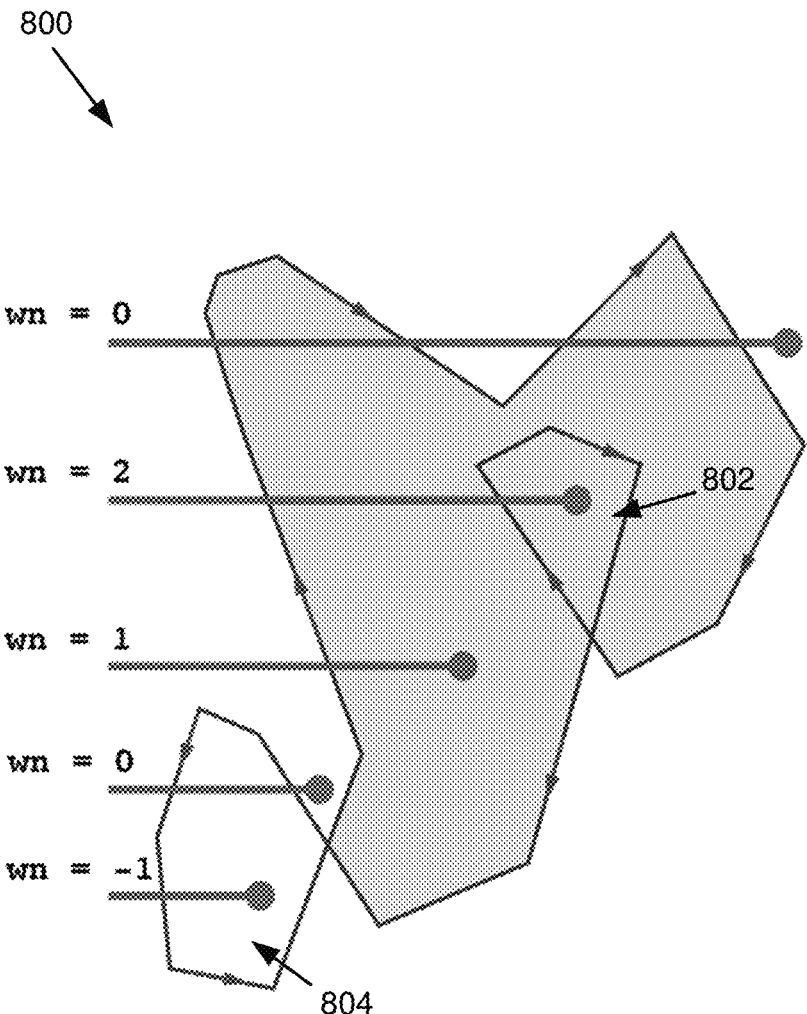
FIG. 8 is a graphical illustration of the clockwise fill rule, whereby the region with the winding number that equals −1 is not filled.

Referring now to FIG. 7, this illustrates an example of an even/odd fill rule. The region in which the winding number is "2" (even number) and is not filled is indicated by reference numeral 702. The region in which the winding number is "−1" (odd) is indicated by reference numeral 704. This is not an illustration of the Clockwise Fill Rule illustrated in FIG. 8. Referring now to FIG. 8, the region in which the winding number is "2" is indicated by reference numeral 802. The region in which the winding number is "−1" and is not filled is represented by reference numeral 804.

The foregoing description of the embodiments of the present invention has been presented for the purposes of illustration and description. It is not intended to be exhaustive or to limit the present invention to the precise form disclosed. Many modifications and variations are possible in light of the above teaching. As will be understood by those familiar with the art, the present inventive technology may be embodied in other specific forms without departing from the spirit or essential characteristics thereof. Likewise, the particular naming and division of the modules, routines, features, attributes, methodologies and other aspects are not mandatory or significant, and the mechanisms that implement the present inventive technology or its features may have different names, divisions and/or formats. Furthermore, as will be apparent to one of ordinary skill in the relevant art, the modules, routines, features, attributes, methodologies and other aspects of the present inventive technology can be implemented as software, hardware, firmware or any combination of the three. Also, wherever a component, an example of which is a module, of the present inventive technology is implemented as software, the component can be implemented as a standalone program, as part of a larger program, as a plurality of separate programs, as a statically or dynamically linked library, as a kernel loadable module, as a device driver, and/or in every and any other way known now or in the future to those of ordinary skill in the art of computer programming. Additionally, the present invention is in no way limited to implementation of its aspects in any specific programming language, or for any specific operating system or environment. Accordingly, the disclosure of the present inventive technology is intended to be illustrative, but not limiting, of the scope of the present invention, which is set forth in the following claims.

What is claimed is:

1. A method for creating a design tool in an interactive graphics system, via executable code stored in a memory coupled to a graphical processing unit, wherein the executable code causes the graphical processing unit to trigger control actions to:

execute an action to present a user interface to a user, to enable the user via the user interface, to create a path of contours, each contour comprising a plurality of points defining the contour, wherein the user interface provides an interface function for the user to categorize each contour as either a hole designation or a fill designation, wherein for contours given the hole designation, the design tool is configured to automatically order the points in a counterclockwise fashion, without user interaction, and for contours given the fill designation, the design tool automatically orders the points in a clockwise fashion without user interaction, wherein in an event that a contour has self-intersections that result in regions with both clockwise and counter-clockwise winding, the design tool orders the points so that a majority of an area of each contour winds in a desired direction.

2. The method according to claim 1, wherein the design tool transmits an instruction to a rendering engine to draw.

3. The method according to claim 2, wherein the design tool in an editor that instructs the rendering engine to fill a region of a resulting path where a winding number is positive.

4. The method according to claim 3, wherein the design tool is implemented in an editor application.

5. The method according to claim 4, wherein the editor application is a program application coupled to a GPU driver.

6. The method according to claim 5, wherein the user interface provides a seamless design experience.

7. The method according to claim 6, wherein a clockwise fill rule identifies positive instances.

8. The method according to claim 1, wherein a path's fill rule determines if a region should be filled based on a winding number.

9. A non-transitory computer-readable medium storing instructions that, when executed on a processor, cause the processor to render a graphic, by performing the steps of:

execute an action to present a user interface to a user, to enable the user via the user interface, to create a path of contours, each contour comprising a plurality of points defining the contour, wherein the user interface provides an interface function for the user to categorize each contour as either a hole designation or a fill designation, wherein for contours given the hole designation, a design tool is configured to automatically order the points in a counterclockwise fashion, without user interaction, and for contours given the fill designation, the design tool automatically orders the points in a clockwise fashion without user interaction, wherein in an event that a contour has self-intersections that result in regions with both clockwise and counter-clockwise winding, the design tool orders the points so that a majority of an area of each contour winds in a desired direction.

10. The non-transitory computer-readable medium according to claim 9, wherein the design tool transmits an instruction to a rendering engine to draw.

11. The non-transitory computer-readable medium according to claim 10, wherein the design tool in an editor that instructs the rendering engine to fill a region of a resulting path where a winding number is positive.

12. The non-transitory computer-readable medium according to claim 11, the design tool is implemented in an editor application.

13. The non-transitory computer-readable medium according to claim 12, the editor application is a program application coupled to a GPU driver.

14. The non-transitory computer-readable medium according to claim 13, the user interface provides a seamless design experience.

15. The non-transitory computer-readable medium according to claim 14, wherein a clockwise fill rule identifies positive instances.

16. The non-transitory computer-readable medium according to claim 15, wherein a path's fill rule determines if a region should be filled based on a winding number.

17. The non-transitory computer-readable medium according to claim 9, wherein the design tool assigns an integer winding number to every region of a path, based on a number of loops that cover the area and by determining whether a surrounding loop is clockwise or counterclock-wise.

18. The non-transitory computer-readable medium according to claim 9, wherein a fill rule associated with the path determines whether the area should be filled, based on a winding number.

19. The non-transitory computer-readable medium according to claim 18, wherein any area with a winding number that is nonzero is filled.

20. The non-transitory computer-readable medium according to claim 18, wherein any area with a winding number that is at least one of odd and positive is filled.

* * * * *